United States Patent [19]

McGroary

[11] Patent Number: 4,684,902
[45] Date of Patent: Aug. 4, 1987

[54] RADIO FREQUENCY SIGNAL GENERATOR

[75] Inventor: Francis X. McGroary, Westport, Conn.

[73] Assignee: Allied Corporation, Morris Township, Morris County, N.J.

[21] Appl. No.: 822,557

[22] Filed: Jan. 27, 1986

[51] Int. Cl.$^4$ ............................................. H03B 21/02
[52] U.S. Cl. ......................................... 331/38; 331/40
[58] Field of Search ...................... 331/38, 40, 46, 55; 332/21, 22, 40, 41; 328/59

[56] References Cited

U.S. PATENT DOCUMENTS 2,973,483  2/1961  Stone, Jr. ................................ 331/38
4,003,003  1/1977  Haeberlin ........................... 332/21 X Primary Examiner—Eugene R. LaRoche
Assistant Examiner—Robert J. Pascal
Attorney, Agent, or Firm—Howard G. Massung; Stanley N. Protigal; Anthony F. Cuoco

[57] ABSTRACT

A radio frequency (RF) signal generator is disclosed which generates a baseband signal at a fixed center frequency and having required modulation characteristics. The baseband signal is translated to a desired output frequency signal by mixing with a step-variable local oscillator signal. Fast frequency modulation is achieved by using a fast tuning oscillator as the source of the baseband signal. The output frequency is generated while preserving all modulation characteristics of the baseband signal and to thereby provide high performance modulation having characteristics at a fixed frequency.

11 Claims, 1 Drawing Figure

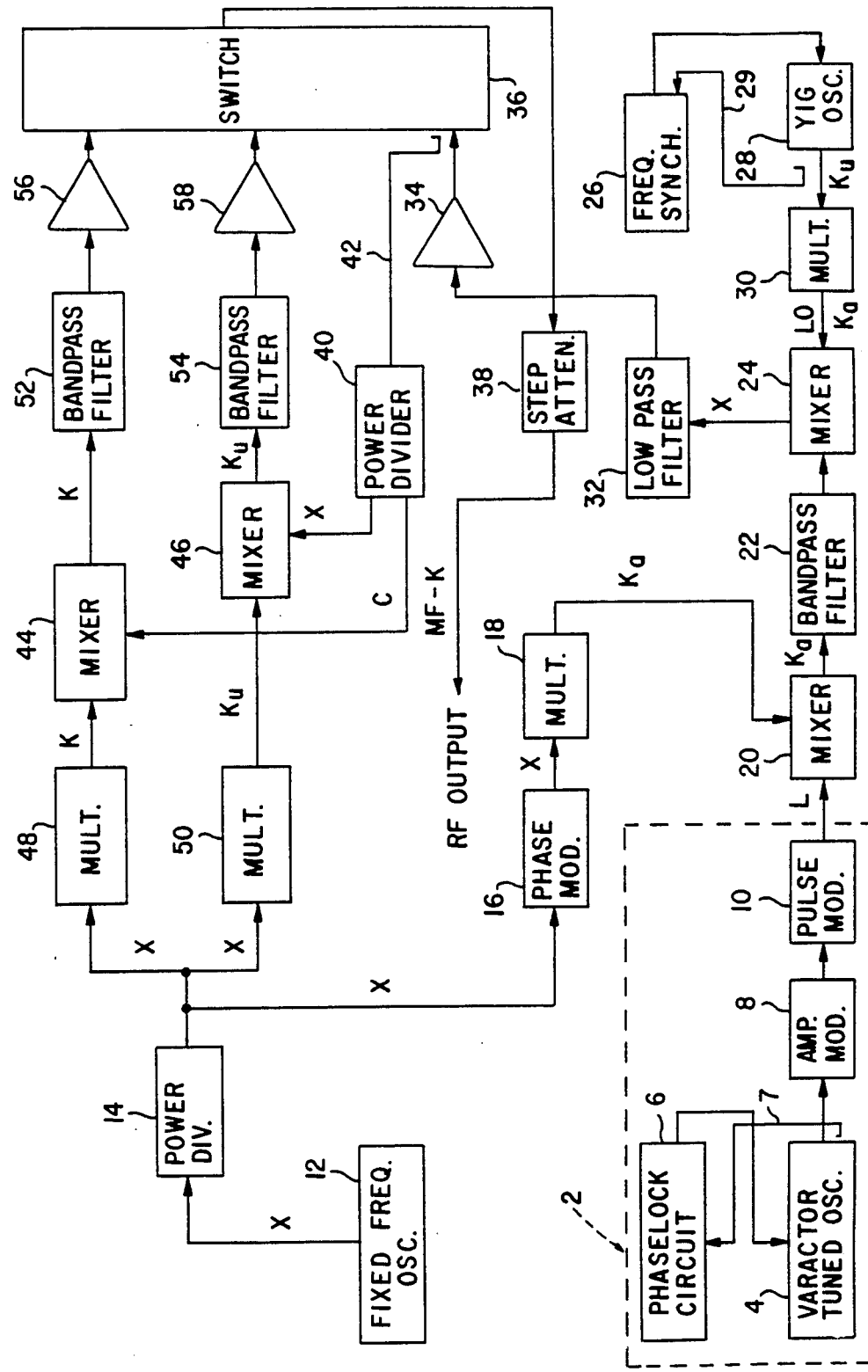

RADIO FREQUENCY SIGNAL GENERATOR

BACKGROUND OF THE INVENTION

Test stations for radar systems and the like often require means for generating radio frequency (RF) stimuli featuring frequency modulation (FM), phase modulation (PHM) and amplitude modulation (AM) with ultrafast tuning rates and wide deviations.

Prior art RF signal generators employ the type of oscillator commonly known as a YIG oscillator as the RF signal source. This type of oscillator has a relatively broad RF frequency range and a relatively good signal to noise ratio and high frequency accuracy. The YIG oscillator, however, is not capable of the fast tuning rates needed to provide fast wide deviation frequency modulation as is required for the intended purposes.

Another type of oscillator, commonly known as the varactor oscillator, is capable of the required fast tuning rates but is not particularly suitable for the intended purposes because of its inferior signal to noise ratio, linearity, temperature stability and RF frequency range compared to the aforenoted YIG oscillator.

In view of the above, it will be understood that the required capabilities of equipment for the intended purposes are beyond frequency generators now known in the art. Accordingly, it is the object of this invention to provide an RF signal generator which combines the features of the aforenoted (YIG and varactor) oscillators to generate radio frequency signals for the intended purposes.

SUMMARY OF THE INVENTION

This invention contemplates a radio frequency (RF) signal generator including means for generating a baseband signal at a fixed center frequency and having required modulation characteristics. Means are provided for translating the baseband signal to a signal having a desired output frequency range, while preserving the aforenoted modulation characteristics. This approach provides high performance modulation capabilities having characteristics which do not vary with frequency, while avoiding the need for broadband modulators. Fast frequency modulation with wide deviation is achieved by using a fast tuning oscillator as the source of the baseband signal. The frequency translation of the baseband signal to the desired RF frequency range is achieved via means for mixing both fixed baseband and variable local oscillator signals.

BRIEF DESCRIPTION OF THE DRAWING

The single FIGURE in the drawing is a block diagram of a radio frequency signal generator according to the invention.

DETAILED DESCRIPTION OF THE INVENTION

Frequency band designations, such as those with which the present invention is concerned, are defined in the U.S. Air Force Frequency Band Designation Regulation No. 105-86 as follows, wherein MHz signifies megahertz and GHz signifies gigahertz:

| Band Designation | Frequency Range |
| --- | --- |
| MF | 10 MHz–300 MHz |
| UMF | 300 MHz–1 GHz |
| L | 1–2 GHz |
| S | 2–4 GHz |
| C | 4–8 GHz |
| X | 8–12 GHz |
| $K_u$ | 12–18 GHz |
| K | 18–27 GHz |
| $K_a$ | 27–40 GHz |

With reference to the above and with reference to the FIGURE, wherein the various frequency bands provided by the components of the invention are indicated, a baseband signal generator is designated generally by the numeral 2 and includes a varactor tuned oscillator 4, a phase lock circuit 6, an amplitude modulator 8 and a pulse modulator 10. Phase lock circuit 6 modulates the frequency of the signal from oscillator 4, with the signal from oscillator 4 being applied to amplitude modulator 8. The signal from amplitude modulator 8 is applied to pulse modulator 10 which provides a linearly modulated RF signal having a fixed center frequency in the L band range and capable of up to ±0.5 GHz deviation. Varactor oscillator 4 is coupled to phase lock circuit 6 via a coupler 7 to provide a feedback loop.

A fixed frequency oscillator 12 provides a signal having a fixed frequency in the X band range, and which signal is applied to a power divider 14 and therefrom to a phase modulator 16 which provides a fixed frequency, phase modulated (±90 degrees) signal in the X band range. The signal from phase modulator 16 is multiplied by a multiplier 18 to provide a fixed frequency signal in the $K_a$ band range with a multiplied phase modulation of ±360 degrees, and which signal is mixed by a mixer 20 with the signal from pulse modulator 10 to provide a mixed signal in the $K_a$ band range.

The $K_a$ band signal from mixer 20, which has ultra-high frequency modulation rates up to 500 MHz, amplitude modulation rates up to 200 MHz, phase modulation rates up to 500 MHz and a linear pulse modulation with 3 nano seconds rise and fall time, is applied to a band pass filter 22 to reject feedthrough and other spurious products, and therefrom to a mixer 24.

A frequency synchronizer 26 is connected to a YIG oscillator 28 which provides programmed signal frequency stepping in the $K_u$ band range, and in effect functions as a standard frequency synthesizer.

The frequency of the signal from oscillator 28 is multiplied by a multiplier 30 to provide a variable frequency local oscillator (LO) signal in the $K_a$ band range. The signal from multiplier 30 is applied to mixer 24 and mixed thereby with the signal from band pass filter 22 to provide a synthesized frequency signal, with all of the aforenoted modulation characteristics, in the X band range which is applied to an X band low pass filter 32. Low pass filter 32 rejects mixer RF/local oscillator feedthrough and spurious products, such as multiples of the RF/local oscillator product which can be in the $K_u$ band range.

The signal from low pass filter 32 is applied through an amplifier 34 to provide the proper power level and routed through a switch 36 to a step attenuator 38 which provides an RF output having a variable frequency in the MF band to K band ranges.

Frequencies above the X band range are generated by upconverting the frequencies in the L band to X band ranges using two fixed local oscillator (LO) frequencies to provide coverage up to the K band range. Thus, amplifier 34 is coupled via a coupler 42 to a power divider 40 which provides variable frequency signals in the C band and X band ranges. The signal in the C band range is applied to a mixer 44 and the signal in the X band is applied to a mixer 46.

The fixed frequency signal in the X band range from power divider 14 is applied to a multiplier 48 and to a multiplier 50. Multiplier 48 provides a signal in the K band range which is applied to mixer 44. Multiplier 50 provides a signal in the $K_u$ band range which is applied to mixer 46. Thus, mixer 44 provides a variable frequency signal in the K band range ($\pm 0.5$ GHz deviation) and mixer 46 provides a variable frequency signal in the $K_u$ band range ($\pm 0.5$ Hz deviation).

The signals from mixers 44 and 46 are applied to bandpass filters 52 and 54, respectively, to reject feedthrough and other mixer spurious products, and are then amplified via amplifiers 56 and 58, respectively, to provide the required power levels.

The outputs from amplifiers 56 and 58 are applied to switch 36 for routing to step attenuator 38 to provide the common variable RF output having a variable frequency in the MF band to K band ranges. Step attenuator 38 is arranged to provide power level control in ten Db steps over a 1200 Db range.

Frequency synchronizer 26 is coupled to YIG oscillator 28 via a power feedback coupler 29. The arrangement is such that the oscillator is phase-locked by the synchronizer to provide frequency stepping in 10 Hz steps, and thus functions as a regular frequency synthesizer.

As will now be understood from the aforegoing description of the invention a baseband signal having all of the required ultrahigh modulation characteristics is generated by baseband signal generator 2 at a fixed center frequency and then translated to the desired output frequencies by appropriate mixing with the synthesized signal from YIG oscillator 28 and filtering, while preserving all of the modulation characteristics of the baseband signal. Thus, high performance modulation capabilities having characteristics that do not vary with frequency while avoiding the need for broadband modulators is realized. Fast frequency modulation with wide deviation is achieved by using a fast tuning oscillator 4 as the source of the baseband signal.

It will be understood that the components of the invention are commercially available in the form of circuit chips or cards and the like and, therefore, the novelty of the invention resides in the arrangement of the components and not in the components themselves.

With the above description of the invention in mind reference is made to the claims appended hereto for a definition of the scope of the invention.

What is claimed is:

1. A radio frequency signal generator, characterized by:

means for providing a baseband radio frequency signal having predetermined ultrafast modulation characteristics, and having a fixed center frequency within a first predetermined frequency band and predetermined frequency deviation rates, including phaselock frequency modulation means, a relatively fast tuning oscillator connected to the phaselock frequency modulation means for locking to said means and for providing a locked output, amplitude modulator means connected to the oscillator for modulating the amplitude of the locked output, and pulse modulator means connected to the amplitude modulator means and responsive to the modulated output therefrom for providing the baseband radio frequency as a pulsed radio frequency output;

means for providing a signal having a fixed frequency within a second predetermined frequency band;

means for mixing the baseband radio frequency signal and the signal having the fixed frequency within the second predetermined frequency band for providing a signal having a fixed frequency within a third predetermined frequency band;

means for providing a signal having a frequency which varies in predetermined increments within a fourth predetermined frequency band;

means for mixing the signal having a fixed frequency within the third predetermined frequency band and the signal having a frequency which varies in predetermined increments within the fourth predetermined frequency band for providing a signal the fourth predetermined frequency band for providing a signal having a frequency which varies within a fifth predetermined frequency band; and means connected to the last mentioned means for routing and attenuating the signal therefrom and for providing an output radio frequency signal having a frequency which varies within a predetermined frequency band range and having the modulation characteristics of the baseband radio frequency signal.

2. A radio frequency generator as described by claim 1, further characterized by:

a feedback loop coupler for coupling the locked output from the oscillator to the phaselock means.

3. A radio frequency signal generator, characterized by:

means for providing a baseband radio frequency signal having predetermined ultrafast modulation characteristics, and having a fixed center frequency within a first predetermined frequency band and predetermined frequency deviation rates;

means for providing a signal having a fixed frequency within a second predetermined frequency band;

means for mixing the baseband radio frequency signal and the signal having the fixed frequency within the second predetermined frequency band for providing a signal having a fixed frequency within a third predetermined frequency band, including a mixer for mixing the baseband radio frequency signal and the signal having the fixed frequency within the second predetermined frequency band and for providing a mixed signal, and filter means connected to the mixer for filtering spurious mixer products from the mixed signal and for providing a filtered signal which is the signal having the first frequency within the third predetermined frequency band;

means for providing a signal having a frequency which varies in predetermined increments within a fourth predetermined frequency band;

means for mixing the signal having a fixed frequency within the third predetermined frequency band and the signal having a frequency which varies in predetermined increments within the fourth predetermined frequency band for providing a signal having a frequency which varies within a fifth predetermined frequency band; and means connected to the last mentioned means for routing and attenuating the signal therefrom and for providing an output radio frequency signal having a frequency which varies within a predetermined frequency band range and having the modulation characteristics of the baseband radio frequency signal.

4. A radio frequency signal generator, characterized by:
   means for providing a baseband radio frequency signal having predetermined ultrafast modulation characteristics, and having a fixed center frequency within a first predetermined frequency band and predetermined frequency deviation rates;
   means for providing a signal having a fixed frequency within a second predetermined frequency band, including oscillator means for providing a signal having a fixed frequency within a sixth predetermined frequency band, phase modulator means for modulating the phase of said fixed frequency signal, and multiplier means connected to the phase modulator means for multiplying the frequency of the phase modulated fixed frequency signal to provide the signal having the fixed frequency within a second predetermined frequency band;
   means for mixing the baseband radio frequency signal and the signal having the fixed frequency within the second predetermined frequency band for providing a signal having a fixed frequency within a third predetermined frequency band;
   means for providing a signal having a frequency which varies in predetermined increments within a fourth predetermined frequency band;
   means for mixing the signal having a fixed frequency within the third predetermined frequency band and the signal having a frequency which varies in predetermined increments within the fourth predetermined frequency band for providing a signal having a frequency which varies within a fifth predetermined frequency band; and
   means connected to the last mentioned means for routing and attenuating the signal therefrom and for providing an output radio frequency signal having a frequency which varies within a predetermined frequency band range and having the modulation characteristics of the baseband radio frequency signal.

5. A radio frequency signal generator as described by claim 4, further characterized by:
   means coupled to the means for providing the signal having a frequency which varies within the fifth predetermined frequency band and responsive to said signal for providing a first signal which varies within a seventh predetermined frequency band and for providing a second signal which varies within an eighth predetermined frequency band, said first and second signals having the predetermined frequency deviation rates;
   first means connected to the oscillator means and responsive to the signal therefrom for providing a third signal having a fixed frequency within a ninth predetermined frequency band;
   second means connected to the oscillator means and responsive to the signal therefrom for providing a fourth signal having a fixed frequency within a tenth predetermined frequency band;
   a first mixer for mixing the first and third signals and for providing a signal having a frequency which varies within an eleventh predetermined frequency band;
   a second mixer for mixing the second and fourth signals and for providing a signal having a frequency which varies within a twelfth predetermined frequency band; and
   the means for providing an output radio frequency signal connected to the first and second mixers and responsive to the signals therefrom for providing the output radio frequency signal.

6. A radio frequency generator as described by claim 5, wherein the means for providing a signal having a frequency which varies within a fourth predetermined frequency band is characterized by:
   frequency synchronizer means;
   oscillator means;
   a power coupler for coupling the oscillator means to the frequency synchronizer means;
   said oscillator means being phase locked by the frequency synchronizer means for providing a signal having a frequency within a selected frequency band; and
   multiplier means connected to the oscillator means for multiplying the frequency of the signal therefrom to provide the signal having a frequency within the fourth predetermined frequency band.

7. A radio frequency signal generator as described by claim 5, wherein the means for mixing the signal having a fixed frequency within the third predetermined frequency band and the signal having a frequency which varies within the fourth predetermined frequency band for providing a signal having a frequency which varies within a fifth predetermined frequency band is characterized by:
   a mixer for mixing the signal having a fixed frequency within the third predetermined frequency band and the signal having a frequency which varies within the fourth predetermined frequency band and for providing a mixed signal; and
   filter means connected to the mixer for filtering spurious mixer products from the mixed signal and for providing a filtered signal which is the signal having a frequency which varies within the fifth predetermined frequency band.

8. A radio frequency signal generator as described by claim 7, wherein the means connected to the last mentioned means for routing and attenuating the signal therefrom and for providing an output radio frequency signal having a frequency which varies within a predetermined frequency band range and having the modulation characteristics of the baseband radio frequency signal is characterized by:
   switching means connected to the filter means;
   step attenuator means connected to the switching means; and
   the switching means routing the filtered signal from the filter means to the step attenuator means which provides the output radio frequency signal in a predetermined plurality of power steps over a predetermined power range.

9. A radio frequency signal generator, characterized by:
   means for providing a baseband radio frequency signal having predetermined ultrafast modulation characteristics, and having a fixed center frequency within a first predetermined frequency band and predetermined frequency deviation rates;
   means for providing a signal having a fixed frequency within a second predetermined frequency band;

means for mixing the baseband radio frequency signal and the signal having the fixed frequency within the second predetermined frequency band for providing a signal having a fixed frequency within a third predetermined frequency band;

means for providing a signal having a frequency which varies in predetermined increments within a fourth predetermined frequency band, including frequency synchronizer means, oscillator means, a power coupler for coupling the oscillator means to the frequency synchronizer means, said oscillator means being phase locked by the frequency synchronizer means for providing a signal having a frequency within a selected frequency band, and multipler means connected to the oscillator means for multiplying the frequency of the signal therefrom to provide the signal having a frequency within the fourth predetermined frequency band;

means for mixing the signal having a fixed frequency within the third predetermined frequency band and the signal having a frequency which varies in predetermined increments within the fourth predetermined frequency band for providing a signal having a frequency which varies within a fifth predetermined frequency band; and means connected to the last mentioned means for routing and attenuating the signal therefrom and for providing an output radio frequency signal having a frequency which varies within a predetermined frequency band range and having the modulation characteristics of the baseband radio frequency signal.

10. A radio frequency signal generator, characterized by:

means for providing a baseband radio frequency signal having predetermined ultrafast modulation characteristics, and having a fixed center frequency within a first predetermined frequency band and predetermined frequency deviation rates;

means for providing a signal having a fixed frequency within a second predetermined frequency band;

means for mixing the baseband radio frequency signal and the signal having the fixed frequency within the second predetermined frequency band for providing a signal having a fixed frequency within a third predetermined frequency band;

means for providing a signal having a frequency which varies in predetermined increments within a fourth predetermined frequency band;

means for mixing the signal having a fixed frequency within the third predetermined frequency band and the signal having a frequency which varies in predetermined increments within the fourth predetermined frequency band for providing a signal having a frequency which varies within a fifth predetermined frequency band, including a mixer for mixing the signal having a fixed frequency within the third predetermined frequency band and the signal having a frequency which varies within the fourth predetermined frequency band and for providing a mixed signal, and filter means connected to the mixer for filtering spurious mixer products from the mixed signal and for providing a filtered signal which is the signal having a frequency which varies within the fifth predetermined frequency band; and means connected to the last mentioned means for routing and attenuating the signal therefrom and for providing an output radio frequency signal having a frequency which varies within a predetermined frequency band range and having the modulation characteristics of the baseband radio frequency signal.

11. A radio frequency signal generator as described by claim 10, wherein the means connected to the last mentioned means for routing and attenuating the signal therefrom and for providing an output radio frequency signal having a frequency which varies within a predetermined frequency band range and having the modulation characteristics of the baseband radio frequency signal is characterized by:

switching means connected to the filter means;

step attenuator means connected to the switching means; and the switch means routing the filtered signal from the filter means to the step attenuator means which provides the output radio frequency signal in a predetermined plurality of power steps over a predetermined power range.

* * * * *